United States Patent
Holm et al.

(10) Patent No.: US 12,421,104 B2
(45) Date of Patent: Sep. 23, 2025

(54) BARRIER STRUCTURE WITHIN A MICROELECTRONIC ENCLOSURE

(71) Applicant: TEXAS INSTRUMENTS INCORPORATED, Dallas, TX (US)

(72) Inventors: Jennifer Lynne Holm, Dallas, TX (US); Simon Joshua Jacobs, Lucas, TX (US); Mary Alyssa Drummond Roby, Plano, TX (US); Kathryn Anne Schuck, Dallas, TX (US); Kelly Jay Taylor, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1026 days.

(21) Appl. No.: 17/363,710

(22) Filed: Jun. 30, 2021

(65) Prior Publication Data

US 2022/0212919 A1     Jul. 7, 2022

Related U.S. Application Data

(60) Provisional application No. 63/134,655, filed on Jan. 7, 2021.

(51) Int. Cl.
    *B81B 7/00*      (2006.01)
    *B81C 1/00*      (2006.01)
    *G02B 26/08*      (2006.01)

(52) U.S. Cl.
    CPC .......... *B81B 7/0038* (2013.01); *B81B 7/0009* (2013.01); *B81B 7/0025* (2013.01); *B81B 7/0029* (2013.01); *B81B 7/0041* (2013.01); *B81B 7/0058* (2013.01); *B81C 1/00285* (2013.01); *G02B 26/0833* (2013.01); *B81B 2201/042* (2013.01); *B81B 2207/11* (2013.01)

(58) Field of Classification Search
    CPC ... B81B 7/0009; B81B 7/0025; B81B 7/0029; B81B 7/0041; B81B 7/0058; B81B 2207/11
    See application file for complete search history.

*Primary Examiner* — David A Zarneke

(74) *Attorney, Agent, or Firm* — Michelle F. Murray; Frank D. Cimino

(57) ABSTRACT

A device includes a first substrate. The device also includes a barrier structure including a metallic layer on the first substrate, where the barrier structure forms a cavity. The device also includes a second substrate on the metallic layer, where the metallic layer extends between the first substrate and the second substrate, and where the metallic layer includes a sloped edge that contacts the first substrate within the cavity.

20 Claims, 6 Drawing Sheets

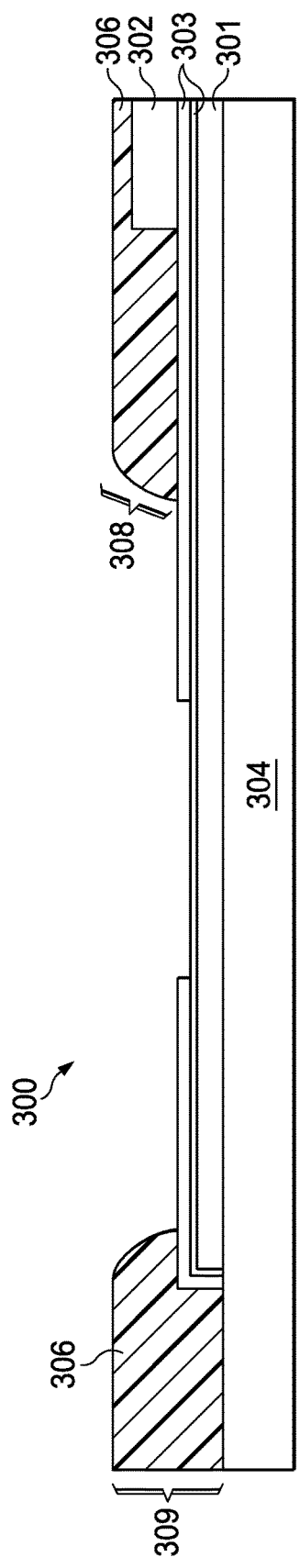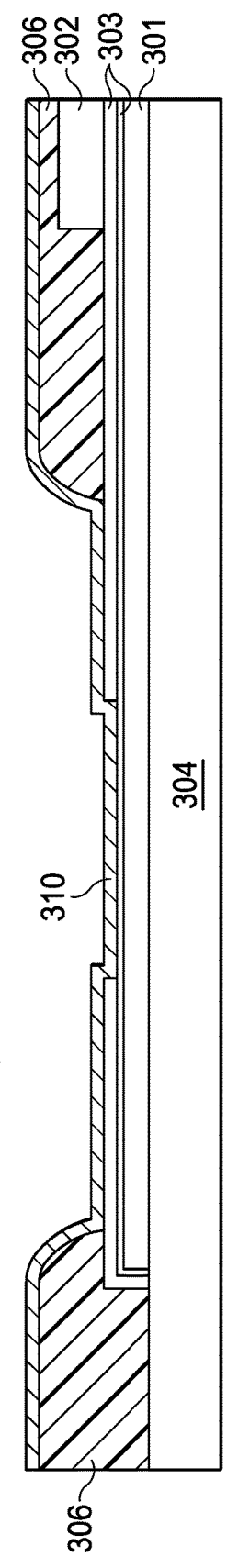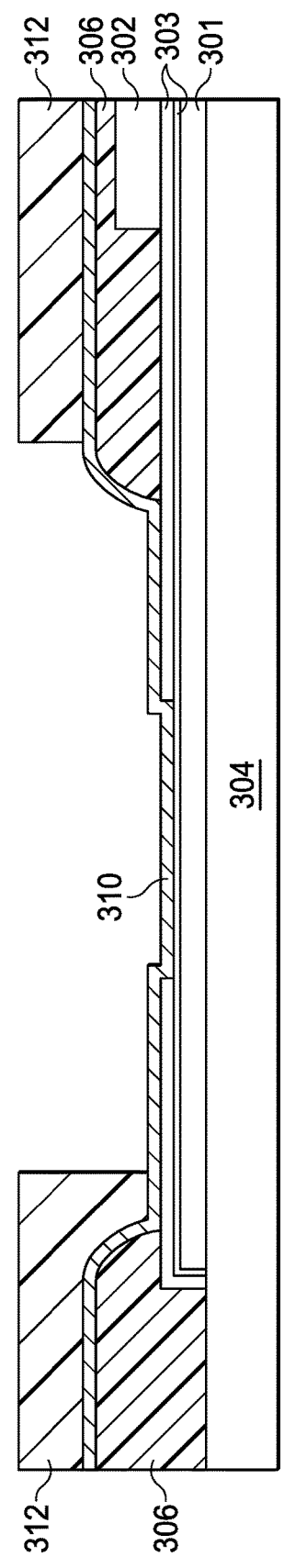

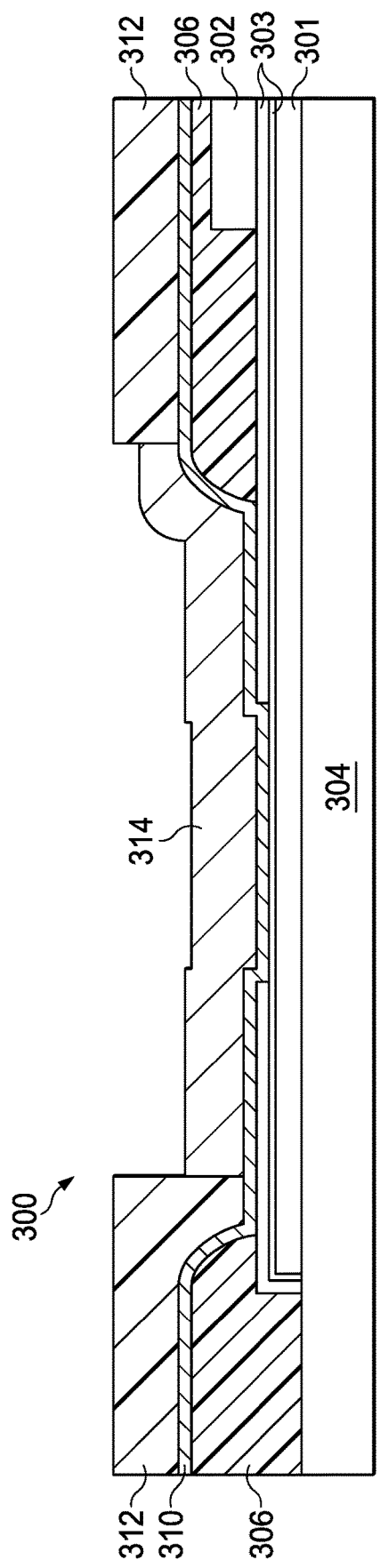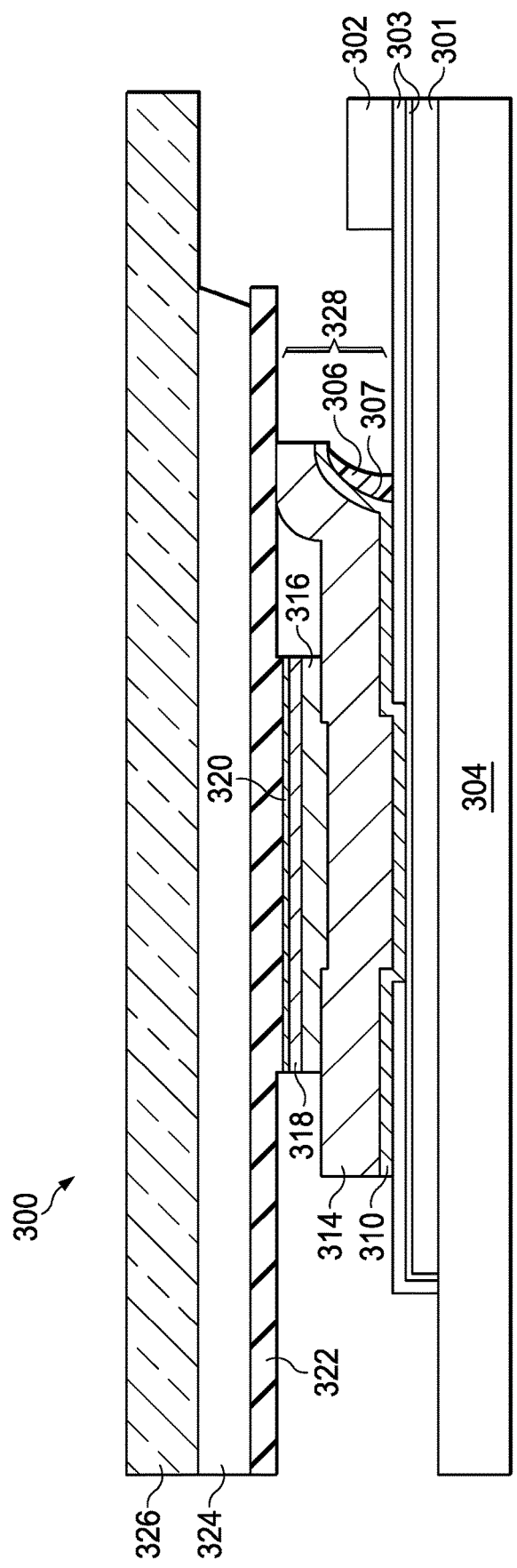
FIG. 3D
FIG. 3E

BARRIER STRUCTURE WITHIN A MICROELECTRONIC ENCLOSURE

CROSS-REFERENCE TO RELATED APPLICATIONS

The present application claims priority to U.S. Provisional Patent Application No. 63/134,655, which was filed Jan. 7, 2021, is titled "Physical Barrier Structure Formed Within A Microelectronic Enclosure," and is hereby incorporated herein by reference in its entirety.

BACKGROUND

Semiconductor devices are manufactured using a variety of liquid or vapor materials. A finished semiconductor device may also have different delineated areas within the device, which are all within a sealed volume. During manufacturing, the liquid or vapor materials may move among the different delineated areas of the semiconductor device.

SUMMARY

In accordance with at least one example of the description, a method includes applying a dielectric material on at least a portion of a first substrate. The method also includes depositing a seed metal on the at least a portion of the first substrate. The method includes depositing a plating photoresist on the seed metal. The method also includes electroplating a metal line on the seed metal, where the plating photoresist forms a boundary for the metal line, and where the metal line forms at least a portion of a barrier structure. The method includes stripping at least a portion of the plating photoresist and etching at least a portion of the seed metal. The method also includes positioning a second substrate relative to the barrier structure to form a cavity.

In accordance with at least one example of the description, a device includes a first substrate. The device also includes a barrier structure including a metallic layer on the first substrate, where the barrier structure forms a cavity. The device also includes a second substrate on the metallic layer, where the metallic layer extends between the first substrate and the second substrate, and where the metallic layer includes a sloped edge that contacts the first substrate within the cavity.

In accordance with at least one example of the description, a device includes a semiconductor device on a first substrate. The device also includes a seed metal on the first substrate. The device includes a metal line on the seed metal. The device also includes one or more metal layers stacked above the metal line, where a second substrate is positioned above at least one of the one or more metal layers, the second substrate covers the semiconductor device. The device also includes a barrier structure including the metal line, where the barrier structure extends between the first substrate and the second substrate to form a cavity in which the semiconductor device is positioned, and where the barrier structure includes a sloped edge, the first substrate contacting one end of the sloped edge.

BRIEF DESCRIPTION OF THE DRAWINGS

FIGS. 3A-3E show a process flow for producing a barrier structure in accordance with various examples.

DETAILED DESCRIPTION

In some semiconductor devices, a transfer of liquid or vapor materials between different areas of the device during manufacturing may cause chemical interactions that can damage the device. For example, semiconductor devices may have two wafers that are coupled to one another via an oxide layer and various metal layers. Chemicals used during manufacturing of the semiconductor device may interact with the metal layers and produce undesirable contaminants. One such contaminant is an indium salt caused by a reaction with indium. This contaminant may damage the semiconductor device either during or after manufacturing and cause reliability issues.

In examples herein, a barrier structure around certain elements of a semiconductor package prevents liquid or vapor materials from moving between or among different delineated areas of the semiconductor device during manufacturing. The elements of the semiconductor device may be within one region that is sealed near its perimeter. With the techniques described herein, the interaction of incompatible materials may be reduced. As an example, the barrier structure can retard the corrosion of base metals that are present in one region of the device by acids or bases that are present in a different region on the device. The barrier structure physically separates different regions or cavity areas created when two monolithic substrates are bonded. The transfer of fluids and vapors between the different regions or cavity areas is reduced or eliminated. The barrier structure may be formed by sputtering and electroplating metals over a gradually sloped dielectric edge in one example herein to form a metallic sloped edge that contacts a substrate.

Figure 1A:
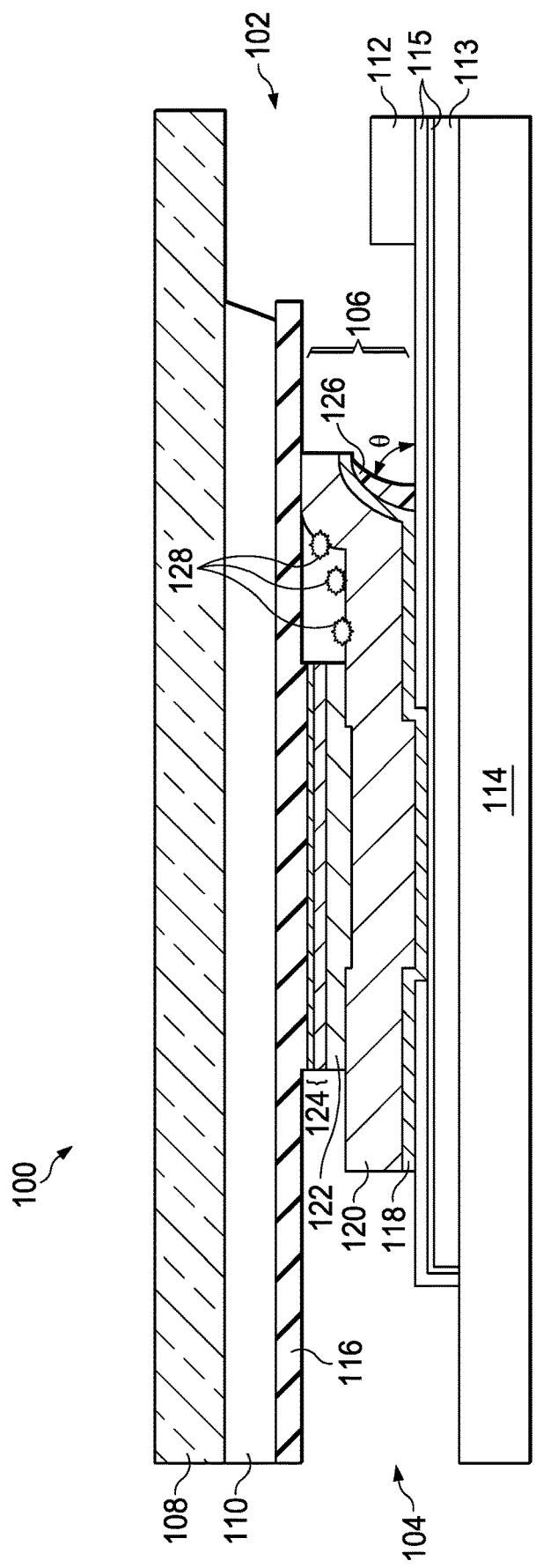
FIG. 1A is a device with a barrier structure in accordance with various examples.

FIG. 1A is a device 100 with a barrier structure in accordance with various examples. Examples of the device 100 include micromechanical switches, such as those found in a digital micromirror device (DMD). Device 100 includes a mini environment 102 that is separated from an outside environment 104 (e.g., outside of the mini environment 102) by a barrier structure 106. Device 100 includes wafer 108, wafer 110, a semiconductor device 112, titanium nitride layer 113, wafer 114, and dielectric layers 115. Wafer 108 may be a glass wafer in one example. Wafer 110 may be a silicon wafer in one example. Wafer 114 may be a complementary metal-oxide-semiconductor (CMOS) wafer in one example. Semiconductor device 112 may be a microelectromechanical system (MEMS) device in one example. Other examples of semiconductor device 112 include microfluidic devices, lab-on-a-chip devices, laser arrays, phase modulators, miniature gas chromatographs, resonators, or optical sensors. Dielectric layers 115 may include any number of layers, and may be patterned as shown in FIG. 1A. Dielectric layers 115 may be oxide layers in one example. Device 100 also includes oxide layer 116, a seed metal 118, an electroplated bond line 120 (e.g., a metal line), a metal layer 122, and metal layers 124. Dielectric material 126 and contaminants 128 are also shown in FIG. 1A. In some examples, seed metal 118 may be any of a number of types of metal layers or alloys, such as titanium-copper (Ti—Cu), nickel nickel-tungsten (Ni—W), titanium-tungsten (Ti—W), or gold. Seed metal 118 may be between 0.2 and 0.3 micrometers thick in one example. In some examples, electroplated bond line 120 may be gold-indium (Au—In), copper-tin (Cu—Sn), gold-tin (Au—Sn), gold-germanium (Au—Ge), aluminum-germanium (Al—Ge), or any other suitable material. Metal layer 122 may be an indium layer or a tin layer in some examples. In this example, contaminants 128 are shown within an empty region between electroplated bond line 120 and oxide layer 116 created by barrier structure 106. In examples herein, barrier structure 106 keeps contaminants 128 away from semiconductor device 112.

The mini environment 102 (e.g., a cavity area) is hermetically sealed in some examples. The mini environment 102 herein includes a semiconductor device 112. Semiconductor device 112 could be a DMD in one example. In another example, the mini environment 102 may include a device other than a MEMS device, such as any semiconductor device found within a sealed environment. The mini environment 102 protects the semiconductor device 112 from material that may damage the semiconductor device 112, such as contaminants 128. In an example, liquids or vapors used within the mini environment 102 during manufacturing may react with metal layer 122 and create salts, such as indium salts if metal layer 122 is indium. For example, an acid may be applied to the wafer 114 to lubricate the semiconductor device 112 for mechanical operation over its lifetime. This acid may interact with the indium of metal layer 122 to produce the indium salts. In other examples, other types of metals may interact with the acid and produce contaminants, such as if tin were used in place of metal layer 122. Also, some of the metals described above with respect to seed metal 118 and electroplated bond line 120 may also interact with the acid to produce contaminants. The indium salts (or other contaminants) are represented by contaminants 128. If the contaminants 128 migrate to semiconductor device 112, semiconductor device 112 may be damaged. Barrier structure 106 prevents or reduces the migration of contaminants 128.

Barrier structure 106 is formed by extending seed metal 118 and electroplated bond line 120 over dielectric material 126, and then removing some or all of dielectric material 126 to complete the mini environment 102. Dielectric material 126 may be photoresist in one example. The details of the formation of barrier structure 106 are described below. By extending electroplated bond line 120 over dielectric material 126, contact or near contact exists between electroplated bond line 120 and oxide layer 116. Because of this contact or near contact, chemicals in mini environment 102 may not interact with metal layer 122, which prevents the introduction of contaminants 128 into the device 100. Near-contact may be sufficient in some examples to prevent the movement of contaminants due to capillary pressure, as described below. If the chemicals do interact with metal layer 122, barrier structure 106 traps contaminants 128 outside mini environment 102 so the contaminants 128 do not migrate to semiconductor device 112. In this example, some dielectric material 126 may remain next to the barrier structure 106. However, in other examples, dielectric material 126 may be removed completely from underneath barrier structure 106.

Wafer 108 covers mini environment 102 and allows light from outside device 100 to reach semiconductor device 112 in this example. Wafer 110 is patterned to create a see-through window through wafer 108 to semiconductor device 112, which is why wafer 110 is shown as not being directly over semiconductor device 112 in FIG. 1A. Patterning has removed the part of wafer 110 that was directly over semiconductor device 112, so light from outside device 100 may reach semiconductor device 112 through a gap in wafer 110. Outside environment 104 represents the environment that is outside of mini environment 102. Barrier structure 106 separates mini environment 102 from outside environment 104 to provide a sealed cavity for semiconductor device 112. In other examples, the material that covers and seals mini environment 102 may not be wafer 108 and wafer 110. The material could be any lid, wafer, window, or a second substrate, where the first substrate is wafer 114 in this example.

As described below, barrier structure 106 and the mini environment 102 are formed by depositing and patterning various layers, including dielectric material 126. Seed metal 118 may include sputtered metal or metals, such as titanium and copper, in one example. The border between dielectric material 126 and seed metal 118 is shown as a curved barrier in device 100. The elements shown in FIG. 1A are not to scale, and the border between dielectric material 126 and seed metal 118 may have another shape in other examples. For example, the border may be a gradual slope of no more than 45 degrees with respect to dielectric layer 115 in one example, represented by the angle θ in FIG. 1A. In other examples, the slope of the barrier structure 106 may be even smaller, such as having a height that increases one micron in the vertical direction for every two to ten microns in the horizontal direction. If the slope is greater than 45 degrees, it may be difficult to deposit a uniform seed metal 118. A slope greater than 45 degrees may also cause defects near the area where the seed metal steps from the flat surface on dielectric layers 115 to coating the dielectric material 126.

In some examples, dielectric material 126 may have a low roughness, such as less than 10 nanometers Ra (roughness average). In some examples, electroplated bond line 120 may have a roughness less than 20 nanometers Ra.

Figure 1B:
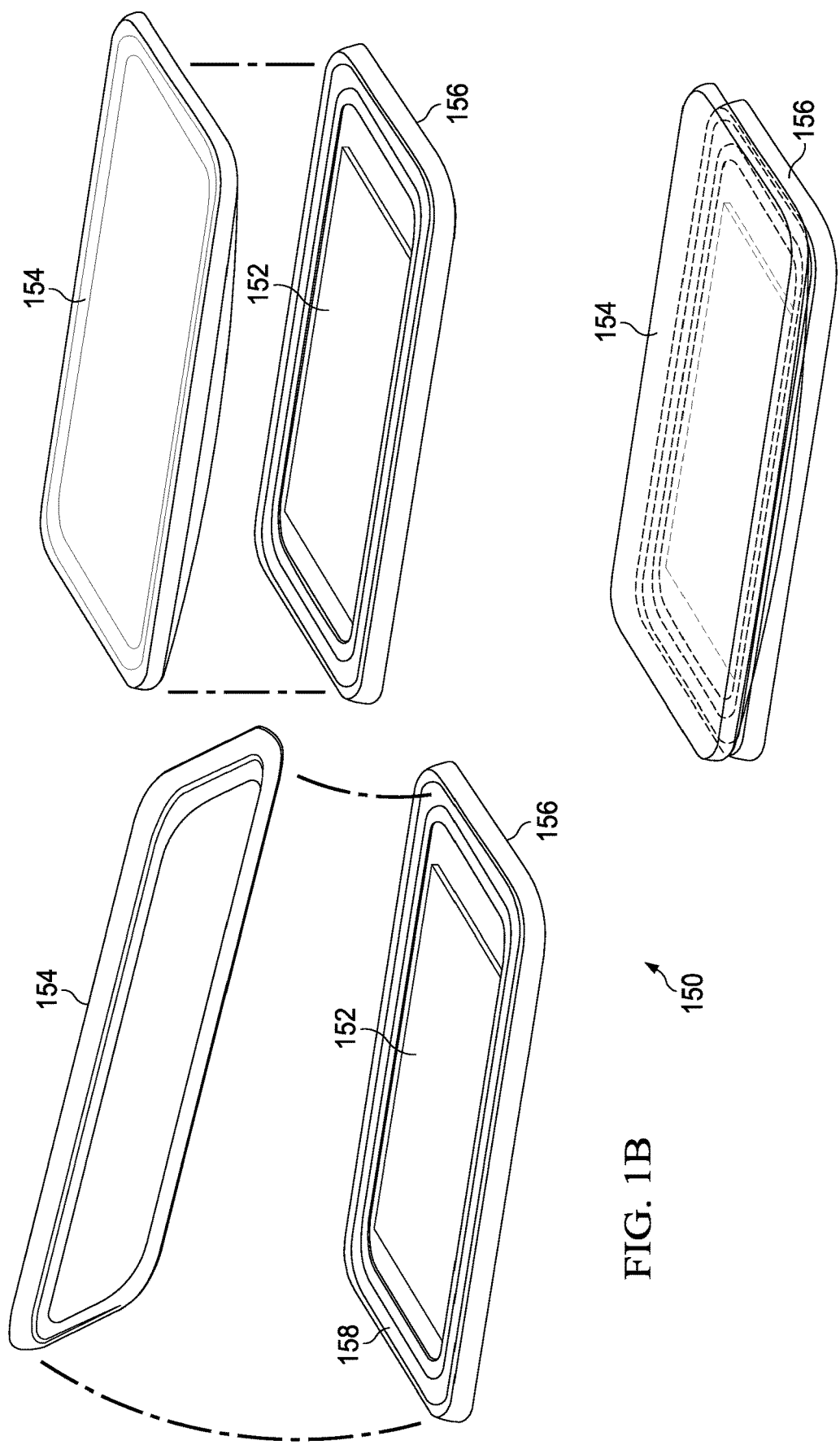
FIG. 1B is a device with a barrier structure in accordance with various examples.

FIG. 1B is a device with a barrier structure in accordance with various examples. FIG. 1B shows three views of a device 150, which is a device such as device 100 in FIG. 1A. Device 150 includes a MEMS device 152 within a cavity. MEMS device 152 is between a first substrate 154 and a second substrate 156. MEMS device 152 is surrounded by a barrier structure 158, which may be barrier structure 106 in an example.

On the left side of FIG. 1B, device 150 is shown with the first substrate 154 and second substrate 156 apart from one another. MEMS device 152 is on second substrate 156 in this example. Barrier structure 158 helps to protect MEMS device 152 from contamination during manufacturing as described above. In another example, a different semiconductor device may reside on second substrate 156 instead of a MEMS device. In the top right of FIG. 1B, first substrate 154 and second substrate 156 are aligned but not yet coupled to one another to form the sealed cavity for MEMS device 152. The bottom right of FIG. 1B shows device 150 where first substrate 154 and second substrate 156 have formed a sealed cavity for MEMS device 152. MEMS device 152 is protected by the sealed cavity formed by first substrate 154 and second substrate 156.

Figure 2:
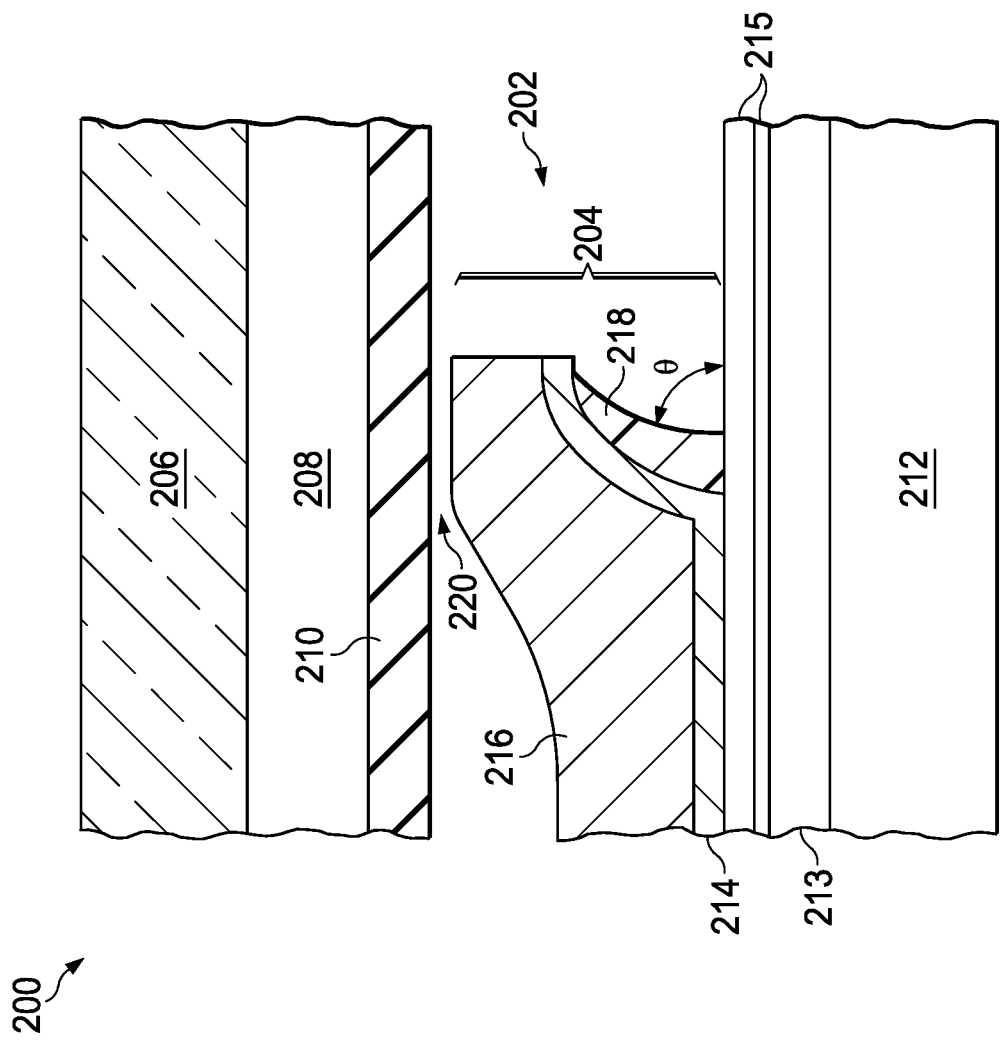
FIG. 2 is a magnified view of a barrier structure in accordance with various examples.

FIG. 2 is a magnified view 200 of a portion of a device, such as device 100, in accordance with various examples. The magnified view 200 shows mini environment 202, barrier structure 204, glass wafer 206, silicon wafer 208, oxide 210, CMOS wafer 212, titanium nitride layer 213, seed metal 214, oxide layers 215, electroplated bond line 216 (e.g., a metal line), photoresist 218, and gap 220. The components in FIG. 2 operate similarly to their counterpart components in FIG. 1A. The components in FIG. 2 may be manufactured as described below.

The barrier structure 204 reduces or prevents the contamination (not shown in FIG. 2) of mini environment 202, similar to barrier structure 106 in FIG. 1A. However, in this example, barrier structure 204 does not contact oxide 210. Instead, barrier structure 204 is close to oxide 210, within two micrometers or less in one example. Barrier structure 204 and oxide 210 form a gap 220 between them. If gap 220 has a sufficient aspect ratio, gap 220 forms a capillary that can capture fluids or vapors that attempt to cross barrier structure 204. Further transmission of fluid or vapor across barrier structure 204 is impeded by the capillary pressure of the fluid or vapor trapped within gap 220. In one example, the aspect ratio of gap 220 that forms a capillary may have a width of 25 micrometers or more, and may have a height of 1 micrometer or less. Therefore, barrier structure 204 does not necessarily have to contact oxide 210 to reduce or prevent contamination of mini environment 202. If the height of the gap is too large, the capillary pressure may not impede transmission of fluid or vapor across the gap.

FIGS. 3A to 3E show a process flow for producing a barrier structure, such as barrier structures 106 and 204, in accordance with various examples herein. FIGS. 3A to 3E show the steps that may be performed to construct the barrier structure as described herein. In other examples, additional steps may be performed, certain steps may be removed, or the steps may be performed in another suitable order. The components in FIGS. 3A to 3E are not necessarily to scale. Also, each of the metal layers and resist layers described below may represent a single layer of a material or multiple layers of materials stacked together.

FIG. 3A is a semiconductor device 300 that includes a titanium layer 301, MEMS device 302, and oxide layers 303 on a CMOS wafer 304. Photoresist 306 or another dielectric material is patterned on at least a portion of semiconductor device 300 to coat MEMS device 302 and create a foundation for the barrier structure that will be fabricated. Photoresist 306 which covers MEMS device 302 also has a slope 308 along a sloped edge that is used to form the barrier structure. As described above, in some examples the slope 308 may be a gradual slope of 45 degrees or less. Here, slope 308 is shown as a steeper slope so the components of semiconductor device 300 may be seen more easily. A slope that is steeper than 45 degrees may make it difficult to deposit a uniform seed metal. A slope greater than 45 degrees may cause defects near the area where the seed metal steps from the flat surface on oxide layers 303 to coating the photoresist 306.

In one example, photoresist 306 has a maximum thickness 309 above the substrate (e.g., CMOS wafer 304) between 4 and 5 micrometers. A photoresist that is too thick may result in bubbles forming in the photoresist. In some examples, the thickness may be increased or decreased within the range provided above to meet any requirements for metallic bonding or compliance of the barrier structure. The final resist structure of photoresist 306 may be created by the application of multiple layers of photoresist and photolithographic processes in some examples. In one example, three separate layers of photoresist are used, with the top layer patterned out (e.g., removed) only in the open area shown in FIG. 3A. The entire body of photoresist may then be etched down to reveal the metal lines (e.g., seed metal 310 and metal line 314, deposited in later steps as described below) in the open area between the photoresist 306 shown in FIG. 3A. The slope 308 of photoresist 306 is determined by the combination of the patterning and etching processes. In one example, a pattern from the third photoresist layer may be transferred into the first and second photoresist layers via etching. The remaining photoresist of the first, second, and third layers form all or part of photoresist 306. In other examples, different numbers of layers may be used to create the resist structure of photoresist 306.

FIG. 3B shows semiconductor device 300 with seed metal 310 deposited on semiconductor device 300. Seed metal 310 facilitates the electroplating of layers above seed metal 310. The materials and thickness of seed metal 310 may vary based on the application. In some examples, titanium, copper, nickel, or gold are used for seed metal 310. A combination of metals may be used for seed metal 310. The combined thickness of seed metal 310 and other metals on seed metal 310 (described below) may be approximately 6 micrometers in some examples. In another example, the thickness is between 5.5 and 6.5 micrometers. In some examples, the thickness of seed metal 310 is uniform along the top of photoresist 306, and/or along the sloped edge of photoresist 306. In some examples, the electrical continuity and thickness uniformity of seed metal 310 over photoresist 306 is enabled by the gradual slope 308 of photoresist 306. In turn, the thickness of additional layers on top of seed metal 310 (described below) are also uniform across both the substrate and the barrier structure. The thickness uniformity allows the dimensions of the barrier structure and other features to be repeatable and manufacturable. The combined thickness of the metals may provide good adhesion and electrical conductivity for plating processes performed in subsequent steps.

FIG. 3C shows semiconductor device 300 with plating photoresist 312 patterned on photoresist 306 and seed metal 310. Plating photoresist 312 has a thickness between 4 and 5 micrometers. In an example, a plating photoresist 312 thickness of 4 to 5 micrometers provides good metal plating uniformity. Plating photoresist 312 is patterned to set boundaries for electroplating in the horizontal direction, which is performed in the next step.

FIG. 3D shows semiconductor device 300 with metal line 314 formed by electroplating. Plating photoresist 312 provides the boundaries for metal line 314 in the horizontal direction. Metal line 314 is electroplated on seed metal 310 in this example. In some examples, metal line 314 is a metallic layer that includes titanium, copper, nickel, or gold. A combination of metals may be used for metal line 314. The thickness of seed metal 310, metal line 314, and other metals may be between 5.5 and 6.5 micrometers as described above. This combined thickness of the metals may provide good adhesion and electrical conductivity for plating processes.

FIG. 3E shows semiconductor device 300 after processing is complete. FIG. 3E includes indium layer 316, metal layer 318, metal layer 320, oxide 322, silicon wafer 324, glass wafer 326, and barrier structure 328. Indium layer 316 may be another metal in other examples. In FIG. 3E, plating photoresist 312 has been stripped and is not present in FIG. 3E. Seed metal 310 that was below plating photoresist 312 is then exposed and stripped. Photoresist 306 is ashed to remove photoresist 306 and reveal MEMS device 302. Removing photoresist 306 reveals a bottom edge 307 of barrier structure 328. This bottom edge 307 contributes to the shape of the final barrier structure 328. One end of the barrier structure 328 extends to the oxide layer 303, while the other end is above the oxide layer 303. Some small amount of photoresist 306 may remain near the barrier structure 328 in one example, due to incomplete removal during the ashing process. The photoresist 306 may be completely removed in other examples. In some examples, a gradual slope of 45 degrees or less may be used for the bottom edge 307 of barrier structure 328. Removing photoresist 306 may also create an air gap between seed metal 310 (and/or metal line 314) and oxide layer 303. The air gap may improve compliance of the barrier structure 328. In some examples, removing photoresist 306 may cause photoresist 306 to taper towards a thickness of zero as photoresist 306 approaches oxide layer 303. In an example, the intersection of photoresist 306 and oxide layer 303 is smooth. The thicknesses of seed metal 310 and metal line 314 may be uniform in this area. Seed metal 310 and/or metal line 314 may follow the contour of photoresist 306 in this area. In some examples, the variation in the thickness of photoresist 306 is less than 0.5 micrometers in the area of barrier structure 328. As shown in FIG. 3E, barrier structure 328 is formed of seed metal 310 and metal line 314 in this example. Barrier structure 328 reduces or prevents contamination of MEMS device 302 by creating a sealed cavity or mini environment 102 around MEMS device 302.

The metallic bond between CMOS wafer 304 and oxide 322 is completed by depositing additional metal layers in this example. Indium layer 316, metal layer 318, and metal layer 320 are deposited to complete the metal layers. Metal layer 318 and metal layer 320 may be any suitable metals, such as titanium, copper, nickel, or gold. A combination of metals may be used for metal layers 318 and 320 in some examples. Layers 314, 316, 318, 320, and 322 may be bonded to their adjoining layers using electroplating in one example. The widths of these layers may vary in some examples. Metal layer 320 is bonded to oxide 322. Silicon wafer 324 is coupled to oxide 322, and glass wafer 326 is coupled to silicon wafer 324.

Seed metal 310, metal line 314, indium layer 316, metal layer 318, and metal layer 320 provide a metallic bond between CMOS wafer 304 (e.g. a first substrate) and the wafers that create the window for MEMS device 302 (e.g., silicon wafer 324 and glass wafer 326, which may be part of a second substrate, along with oxide 322). This metallic bond helps to seal semiconductor device 300 and create a mini environment 102 around MEMS device 302. As described above, other types of devices may be sealed in a mini environment 102 other than MEMS device 302.

The lid (e.g., oxide 322, silicon wafer 324, and glass wafer 326) that seals semiconductor device 300 may be a second substrate in some examples. The second substrate could include a second independent semiconductor substrate, or a bonded stack of two or more substrates. The second substrate (or bonded stack) could singularly or collectively have been created through processes separate and independent from the processes used to create the first semiconductor substrate (CMOS wafer 304 in this example).

The lid or second substrate that seals the cavity may be sealed with transient liquid phase bonding in one example. Transient liquid phase bonding is also known as solid-liquid interdiffusion bonding. In this technique, an interlayer melts, and the interlayer element diffuses into the substrate materials, thereby causing isothermal solidification. This process results in a bond that has a higher melting point than the bonding temperature. This type of bonding enables low process temperatures while providing higher remelt temperature after joining the wafers.

The lid or second substrate that seals the cavity may be sealed with adhesive bonding in another example. Adhesive bonding involves the use of an adhesive and often involves a relatively lower bonding temperature.

The lid that seals the cavity may be joined to the first substrate (such as CMOS wafer 304) by any suitable technique, including, for example, metal bonding, direct bonding, anodic bonding, reactive bonding, and adhesive bonding. Further examples of metal bonding include, without limitation, solid-liquid interdiffusion bonding, eutectic bonding, and thermocompression bonding.

The bonding materials may be patterned before or after deposition by wafer processing techniques in order to form one or more individual cavities containing the barrier structure described herein. This approach is also referred to as wafer-level packaging. In wafer-level packaging, individual device packages are formed, at least in part, by parallel processing of multiple dies in wafer form prior to the wafer being divided into individual microelectronic devices or chips. Some examples herein may be formed by wafer-level packaging, as the formation of the barrier structure and bonding structures are executed with wafer-form processes.

The materials that form the final structures on the first substrate and the lid or second substrate may be deposited by any of a number of thin film wafer-form processes, including evaporation, sputtering, electroplating, ion-beam deposition, chemical vapor deposition, photoresist deposition, photolithography, etching, cleaning, and the like.

Also, the second substrate could be non-planar in some examples. The non-planar features may contribute to the formation of the barrier structure within the cavity package by close vertical approach, such as less than 1 micrometer, to create the sealed cavity via the capillary action described above. In another example, the second substrate may have vertical contact with the barrier structure 328 on the first semiconductor substrate (CMOS wafer 304).

In examples herein, the barrier structures 328 may be fabricated using techniques for creating a metallic bond between wafers without additional mask levels. The fabrication techniques herein produce films and barrier structures with a high degree of uniformity, which makes the techniques repeatable. The structure described herein may be designed with variable degrees of compliance. Some the structures described herein may be inspected non-destructively with acoustic microscopy. The barrier structures are also fabricated with the same materials as the active areas of the semiconductor device, which assures compatibility of materials.

Figure 4:
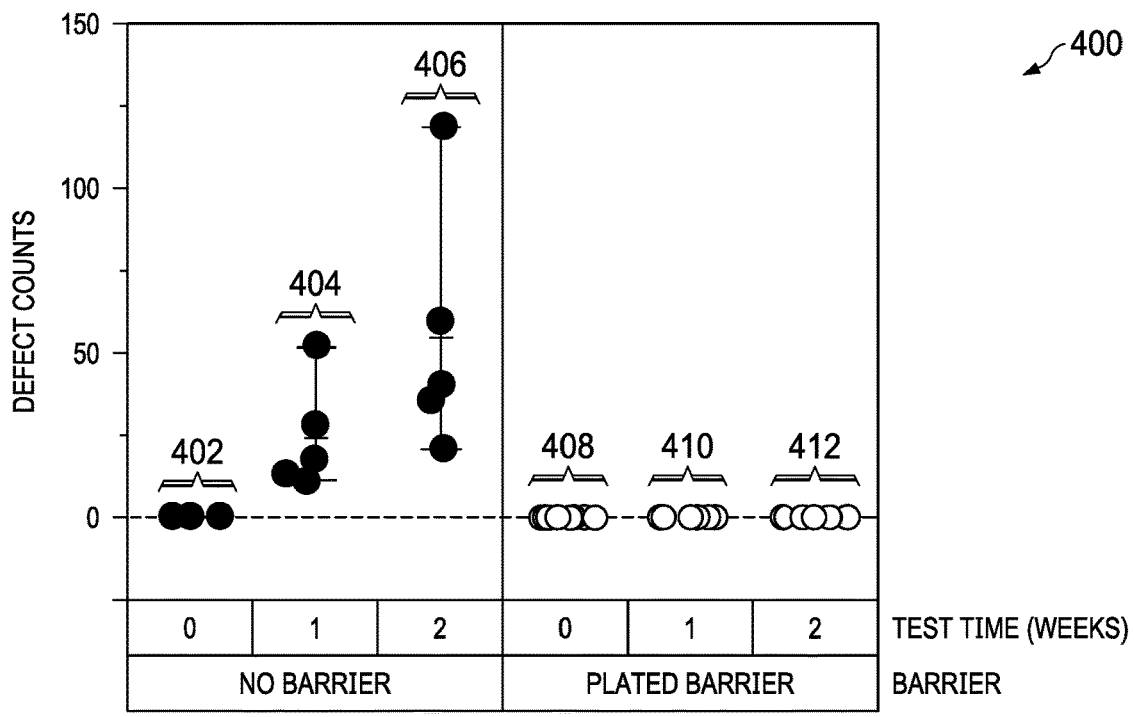
FIG. 4 is graph of defect counts for devices with a barrier structure and devices without a barrier structure in accordance with various examples.

FIG. 4 is a graph 400 of defect counts for devices with a barrier structure and devices without a barrier structure in accordance with various examples herein. The defects are failures in the semiconductor device, such as semiconductor device 112, caused by the contaminants 128 that are present on the semiconductor device. The x-axis of graph 400 represents the number of defects, while the y-axis represents the test time in weeks for each device. The left half of graph 400 shows the defect counts for five devices without a barrier structure after zero weeks, one week, and two weeks. The right half of graph 400 shows the defect counts for five devices with a barrier structure after zero weeks, one week, and two weeks.

As shown in FIG. 4, defect counts 402 represent defects in the devices without barrier structures at zero weeks, or at the time the devices were manufactured. At zero weeks, the devices without barrier structures had zero defects. Defect counts 404 represent defects in the devices without barrier structures at one week. At one week, the devices had various defect counts between about 10 to about 50 defects.

Defect counts 406 represent defects in the devices without barrier structures at two weeks. At two weeks, the devices without barrier structures had defect counts between about 20 to about 120. Therefore, devices without barrier structures can sometimes exhibit high numbers of defects even at one or two weeks.

Defect counts 408, 410, and 412 represent defects in devices with barrier structures at zero weeks, one week, and two weeks, respectively. The defect counts 408, 410, and 412 are all zero. Therefore, the barrier structure as described herein reduces defects considerably compared to devices without barrier structures.

Figure 5:
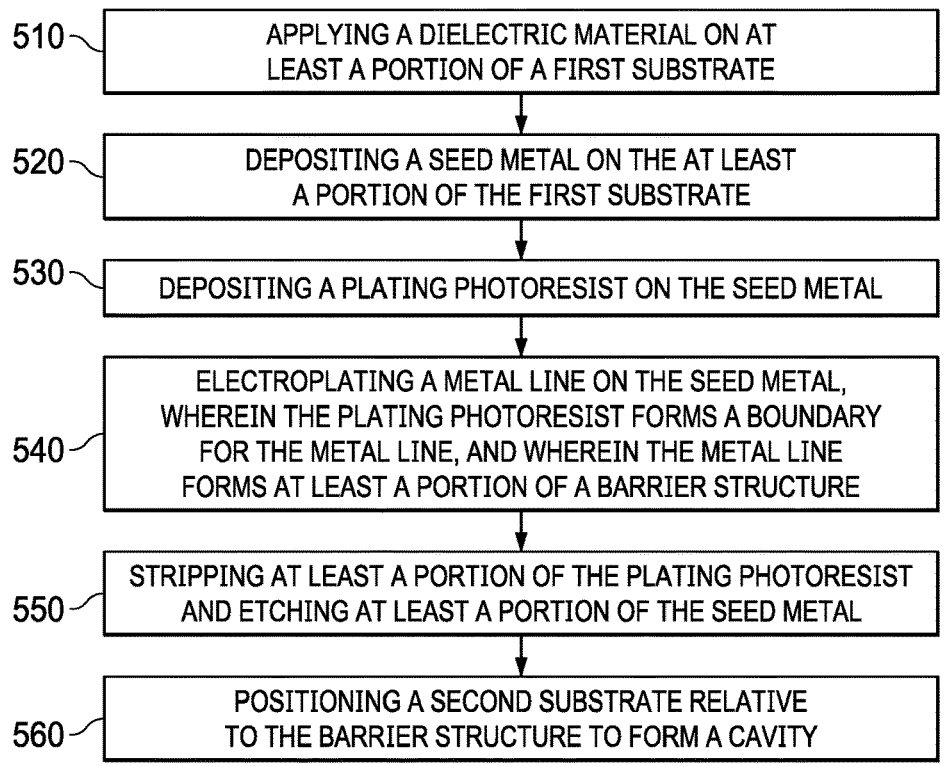
FIG. 5 is a flow diagram of a method for producing a barrier structure in accordance with various examples.

FIG. 5 is a flow diagram of a method 500 for producing a barrier structure in accordance with various examples herein. The steps of method 500 may be performed in any suitable order, and additional steps may be included in some examples.

Method 500 begins at 510, where a dielectric material is applied on at least a portion of a first substrate. The dielectric material may be applied over a semiconductor device. The dielectric material may be a photoresist in one example.

The dielectric material may be patterned on a semiconductor device to coat a MEMS device or other component, and to create a foundation for the barrier structure that will be fabricated. The dielectric material also has a slope along an edge that is used to form the barrier structure. As described above, in some examples the slope may be a gradual slope of 45 degrees or less. The application of the dielectric material is described above with respect to FIG. 3A.

Referring again to FIG. 5, method 500 continues at 520, where a seed metal is deposited on at least a portion of the first substrate, and may be deposited on the portion of the first substrate containing the dielectric material. The seed metal facilitates electroplating of layers above the seed metal to layers below the seed metal. The materials and thickness of the seed metal may vary based on the application. In some examples, titanium, copper, nickel, or gold may be used as the seed metal. In other examples, a combination of metals may be used for the seed metal, such as a titanium-copper seed metal. The deposition of the seed metal is described above with respect to FIG. 3B.

Method 500 continues at 530, where a plating photoresist is deposited on the seed metal. In one example, the plating photoresist is deposited on at least a portion of the seed metal and at least a portion of the dielectric material. The plating photoresist is patterned to set one or more boundaries for an electroplating step performed later. In one example, the plating photoresist partially covers the dielectric material applied at step 510 and the seed metal applied at step 520. Partially covering the dielectric material and seed metal in this manner allows the dielectric material and seed metal to be formed into part of the barrier structure. In one example, the plating photoresist has a thickness between 4 and 5 micrometers, which may be increased or decreased in other examples. The deposition of the plating photoresist is described above with respect to FIG. 3C.

Method 500 continues at 540, where a metal line is electroplated on the seed metal, where the plating photoresist forms a boundary for the metal line, and where the metal line forms at least a portion of a barrier structure. In the example described above with respect to FIG. 3D, plating photoresist 312 provides a boundary on each side of the metal line 314. The metal line provides at least a portion of the barrier structure between the semiconductor device and an outside environment, or between other regions of the first substrate in other examples.

Referring again to FIG. 5, method 500 continues at 550, where at least a portion of the plating photoresist is stripped. Also, at 550, at least a portion of the seed metal is etched. The seed metal that is etched may be the seed metal that is exposed if the plating photoresist is stripped. Because the plating photoresist provided at least one boundary for the metal line, stripping the plating photoresist exposes one or more edges of the metal line.

Method 500 continues at 560, where a second substrate is positioned relative to the barrier structure to form a cavity. The cavity may be a sealed cavity, and a semiconductor device may be positioned inside the sealed cavity in some examples. The second substrate may be a lid, wafer, window, or another substrate in some examples. The second substrate could include a second independent semiconductor substrate, or a bonded stack of two or more substrates. The lid or second substrate that seals the cavity may be sealed with transient liquid phase bonding in one example. The lid or second substrate that seals the cavity may be sealed with adhesive bonding in another example.

In an additional step, after etching at least a portion of the seed metal, at least a portion of the dielectric material may be removed to reveal the semiconductor device and create the barrier structure. The dielectric material may be ashed to remove the dielectric material in one example. The removal of dielectric material provides an undercut at the bottom of the barrier structure. The bottom of the barrier structure has a shape determined by the amount and shape of the dielectric material that is removed. The undercut provides the slope of barrier structure as described above. In some examples, a gradual slope is used for the bottom of the barrier structure. As shown in FIG. 3E and described above, the barrier structure is formed by a combination of photoresist, seed metal, and the metal line. The barrier structure reduces or prevents contamination of a cavity or mini environment as described in examples herein.

In additional steps, the metallic bond is completed by depositing additional metal layers. For example, indium layer 316, metal layer 318, and metal layer 320 are deposited to complete the metal layers in FIG. 3E. These metal layers may be deposited after step 560 of method 500 using any suitable technique. These metal layers may include any suitable metals, such as titanium, copper, nickel, or gold. A combination of metals may be used for these metal layers in some examples. After the metal layers are deposited, the metal layers may be bonded to an oxide, such as oxide 322. Then, a silicon wafer (such as silicon wafer 324) and a glass wafer (such as glass wafer 326) may be added to complete the semiconductor device.

In this description, the term "couple" may cover connections, communications or signal paths that enable a functional relationship consistent with this description. For example, if device A provides a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal provided by device A.

While certain components may be described herein as being of a particular process technology, these components may be exchanged for components of other process technologies.

Unless otherwise stated, "about," "approximately," or "substantially" preceding a value means +/−10 percent of the stated value. Modifications are possible in the described examples, and other examples are possible within the scope of the claims.

What is claimed is:

1. A device, comprising:
   a first substrate;
   a barrier structure including a metallic layer on the first substrate, wherein the barrier structure forms a cavity; and
   a second substrate on the metallic layer, wherein the metallic layer extends between the first substrate and the second substrate, and wherein the metallic layer includes a sloped edge that contacts the first substrate within the cavity.

2. The device of claim 1, wherein the second substrate is a glass wafer that includes a window.

3. The device of claim 1, further comprising an indium layer on the metallic layer.

4. The device of claim 1, wherein the metallic layer includes a titanium-copper seed metal and an electroplated bond line, and has a thickness between 5.5 and 6.5 micrometers.

5. The device of claim 4, wherein the titanium-copper seed metal has a thickness between 0.2 and 0.3 micrometers.

6. The device of claim 1, wherein the sloped edge includes a slope of 45 degrees or less.

7. The device of claim 1, wherein the metallic layer and the second substrate are separated by a gap of less than 1 micrometer.

8. The device of claim 1, further comprising:
   a semiconductor device on the first substrate.

9. A device, comprising:
   a semiconductor device on a first substrate;
   a seed metal on the first substrate;
   a metal line on the seed metal;
   one or more metal layers stacked above the metal line, wherein a second substrate is positioned above at least one of the one or more metal layers, the second substrate covers the semiconductor device; and
   a barrier structure including the metal line, wherein the barrier structure extends between the first substrate and the second substrate to form a cavity in which the semiconductor device is positioned, and wherein the barrier structure includes a sloped edge, the first substrate contacting one end of the sloped edge.

10. The device of claim 9, wherein the semiconductor device is a digital micromirror device.

11. The device of claim 9, wherein the sloped edge includes a slope of 45 degrees or less.

12. The device of claim 9, wherein the barrier structure includes the seed metal.

13. The device of claim 9, wherein the second substrate is a glass wafer.

14. A device, comprising:
    a first substrate;
    a barrier structure including a metallic layer on the first substrate, wherein the barrier structure forms a cavity; and
    a second substrate over the metallic layer, wherein the metallic layer extends from the first substrate towards the second substrate, and wherein the metallic layer includes a sloped edge, a gap between the metallic layer and the second substrate.

15. The device of claim 14, wherein the gap has a height between the metallic layer and the second substrate and a width, the height is less than or equal to one micrometer and the width greater than or equal to 25 micrometers.

16. The device of claim 14, further comprising a microelectromechanical systems (MEMS) device on the first substrate in the cavity.

17. The device of claim 14, further comprising an indium layer on the metallic layer.

18. The device of claim 14, wherein the metallic layer includes a titanium-copper seed metal and an electroplated bond line, and has a thickness between 5.5 and 6.5 micrometers.

19. The device of claim 18, wherein the titanium-copper seed metal has a thickness between 0.2 and 0.3 micrometers.

20. The device of claim 14, wherein the sloped edge includes a slope of 45 degrees or less.

* * * * *